(12) United States Patent
Manipatruni et al.

(10) Patent No.: US 11,107,908 B2
(45) Date of Patent: Aug. 31, 2021

(54) TRANSISTORS WITH METAL SOURCE AND DRAIN CONTACTS INCLUDING A HEUSLER ALLOY

(71) Applicant: Intel Corporation, Santa Clara, CA (US)

(72) Inventors: Sasikanth Manipatruni, Hillsboro, OR (US); Anurag Chaudhry, Portland, OR (US); Dmitri E. Nikonov, Beaverton, OR (US); Jasmeet S. Chawla, Hillsboro, OR (US); Christopher J. Wiegand, Portland, OR (US); Kanwaljit Singh, Portland, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 16/306,540

(22) PCT Filed: Jul. 1, 2016

(86) PCT No.: PCT/US2016/040877
§ 371 (c)(1),
(2) Date: Nov. 30, 2018

(87) PCT Pub. No.: WO2018/004700
PCT Pub. Date: Jan. 4, 2018

(65) Prior Publication Data
US 2019/0181249 A1    Jun. 13, 2019

(51) Int. Cl.
*H01L 29/66* (2006.01)
*H01L 29/45* (2006.01)
(Continued)

(52) U.S. Cl.
CPC ........ *H01L 29/66984* (2013.01); *B82Y 10/00* (2013.01); *H01L 21/28537* (2013.01);
(Continued)

(58) Field of Classification Search
CPC ............. H01L 29/475; H01L 29/66356; H01L 29/66469; H01L 29/7391; H01L 29/775;
(Continued)

(56) References Cited

U.S. PATENT DOCUMENTS

2007/0058301 A1    3/2007 Shimazawa et al.
2008/0217711 A1    9/2008 Sugiyama et al.
(Continued)

FOREIGN PATENT DOCUMENTS

JP    2009-054880 A    3/2009

OTHER PUBLICATIONS

International Search Report and Written Opinion dated Apr. 26, 2017 for International Patent Application No. PCT/US2016/040877, 12 pages.
(Continued)

*Primary Examiner* — Seahvosh Nikmanesh
(74) *Attorney, Agent, or Firm* — Schwabe, Williamson & Wyatt, P.C.

(57) ABSTRACT

Embodiments herein describe techniques for a semi-conductor device comprising a channel having a first semiconductor material; a source contact coupled to the channel, comprising a first Heusler alloy; and a drain contact coupled to the channel, comprising a second Heusler alloy. The first Heusler alloy is lattice-matched to the first semiconductor material within a first predetermined threshold. A first Schottky barrier between the channel and the source contact, and a second Schottky barrier between the channel and the drain contact are negative, or smaller than another predetermined threshold. The source contact and the drain contact can be
(Continued)

applied to a strained silicon transistor, an III-V transistor, a tunnel field-effect transistor, a dichalcogenide (MX2) transistor, and a junctionless nanowire transistor.

21 Claims, 9 Drawing Sheets (51) Int. Cl.
*H01L 29/775* (2006.01)
*H01L 29/10* (2006.01)
*H01L 29/739* (2006.01)
*H01L 29/06* (2006.01)
*B82Y 10/00* (2011.01)
*H01L 29/786* (2006.01)
*H01L 29/423* (2006.01)
*H01L 29/417* (2006.01)
*H01L 21/285* (2006.01)
*H01L 29/16* (2006.01)
*H01L 29/20* (2006.01)
*H01L 29/24* (2006.01)
*H01L 29/47* (2006.01)
*H01L 29/78* (2006.01)

(52) U.S. Cl.
CPC .... *H01L 21/28581* (2013.01); *H01L 29/0669* (2013.01); *H01L 29/0673* (2013.01); *H01L 29/1054* (2013.01); *H01L 29/16* (2013.01); *H01L 29/20* (2013.01); *H01L 29/24* (2013.01); *H01L 29/41791* (2013.01); *H01L 29/42392* (2013.01); *H01L 29/45* (2013.01); *H01L 29/452* (2013.01); *H01L 29/456* (2013.01); *H01L 29/47* (2013.01); *H01L 29/475* (2013.01); *H01L 29/66356* (2013.01); *H01L 29/66439* (2013.01); *H01L 29/66469* (2013.01); *H01L 29/7391* (2013.01); *H01L 29/775* (2013.01); *H01L 29/7849* (2013.01); *H01L 29/78654* (2013.01); *H01L 29/78681* (2013.01); *H01L 29/785* (2013.01)

(58) Field of Classification Search
CPC .......... H01L 29/7849; H01L 29/78654; H01L 29/78681

See application file for complete search history.

(56) References Cited

U.S. PATENT DOCUMENTS

| | | |
|---|---|---|
| 2010/0072528 A1 | 3/2010 | Inokuchi et al. |
| 2010/0171158 A1 | 7/2010 | Sugahara et al. |
| 2010/0276662 A1 | 11/2010 | Colinge |
| 2012/0273856 A1 | 11/2012 | Ishikawa et al. |
| 2014/0183453 A1 | 7/2014 | Kim et al. |
| 2015/0132920 A1 | 5/2015 | Vellianitis et al. |
| 2020/0152781 A1* | 5/2020 | Manipatruni ........... H01L 29/18 |

OTHER PUBLICATIONS

Office Action dated Mar. 12, 2021 for Taiwan Patent Application No. 106117441, 15 pages.

* cited by examiner

TRANSISTORS WITH METAL SOURCE AND DRAIN CONTACTS INCLUDING A HEUSLER ALLOY

CROSS REFERENCE TO RELATED APPLICATIONS

The present application is a national phase entry under 35 U.S.C. § 371 of International Application No. PCT/US2016/040877, filed Jul. 1, 2016, entitled "TRANSISTORS WITH METAL SOURCE AND DRAIN CONTACTS INCLUDING A HEUSLER ALLOY", which designated, among the various States, the United States of America. The PCT/US2016/040877 Application is hereby incorporated by reference.

FIELD

Embodiments of the present disclosure generally relate to the field of integrated circuits, and more particularly, to transistors having a source contact and a drain contact with reduced resistance.

BACKGROUND

The device scaling has reduced the channel thickness in the field-effect transistors (FETs). At the meantime, source and drain contact resistances may play a more significant role in the scaled complementary metal-oxide-semiconductor (CMOS) transistors as the dimensions of the contacts approach the electron mean free path. As the electron mean free path in the source and drain contacts approaches the critical dimensions, the source and drain contact resistances increase dramatically.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 4A schematically illustrates a process for forming a channel based on a Heusler metallic layer as a template, while

DETAILED DESCRIPTION

Source and drain contact resistances may play a significant role in the performance of scaled CMOS transistors as the dimensions of the source and drain contacts approach the electron mean free path. Large source and drain contact resistances may be caused by high Schottky barrier heights between the source contact and the channel, or the drain contact and the channel. Heusler alloys have lattice parameters and work functions that are highly tunable and close to various semiconductor materials, e.g. Si(111) or III-V semiconductors. Templated metallic source and drain contacts formed by Heusler alloys may be naturally lattice matched to the semiconductor channel material, while the Schottky barrier heights, or simply referred to as Schottky barrier between the Heusler alloy contacts (e.g., source and drain contacts) and the channel may be negative or small, hence reducing the source and drain contact resistances.

In various embodiments, a semiconductor device may comprise a channel including a first semiconductor material; a source contact coupled to the channel and a drain contact coupled to the channel. In embodiments, the source contact may comprise a first Heusler alloy; and the drain contact may comprise a second Heusler alloy. The first Heusler alloy and the second Heusler alloy may be lattice-matched to the materials of the channel so that a difference between the Heusler alloy lattice parameter and the channel material lattice parameter is within a predetermined threshold to reduce the source and drain contact resistances.

In embodiments, a first Schottky barrier between the channel and the source contact, and a second Schottky barrier between the channel and the drain contact may be negative, or smaller than another predetermined threshold. The lattice matching of the source contact to the channel, the lattice matching of the drain contact to the channel, the control of the first Schottky barrier, and the control of the second Schottky barrier may be determined by the choice of the Heusler alloy used as the source contact and/or the drain contact.

In embodiments, the source contact including the first Heusler alloy, and the drain contact including the second Heusler alloy may be applied to various transistors, such as strained silicon transistors, transistors, tunnel field-effect transistors (TFETs), dichalcogenide (MX2) transistors, and junctionless nanowire transistors.

In embodiments, for a strained silicon transistor, the channel may comprise Si(111), and the first Heusler alloy for the source contact and/or the second Heusler alloy for the drain contact may comprise $Co_2FeSi$. Alternatively, the channel may comprise Si(111), and the first Heusler alloy for the source contact and/or the second Heusler alloy for the drain contact may comprise $Fe_{3-x}Mn_xSi$, which can have lattice parameters matching the lattice parameter of the channel material by controlling the value of x, indicating a Mn composition.

In embodiments, for an III-V transistor, the channel may comprise GaAs, the first Heusler alloy for the source contact may comprise $Co_2CrFeAl$ or $Co_2MnSi$, and the second Heusler alloy for the drain contact may comprise $Co_2CrFeAl$ or $Co_2MnSi$.

In embodiments, for a TFET in which a channel includes a first semiconductor material (e.g., GaSb) and a second material (e.g., InAs), the first Heusler alloy may comprise a material selected from a group consisting of $Ni_2MnIn$, $CuMnSb$, $Rh_xPd_{1-x}MnAl$, and $Rh_{2-x}PdMnGe$, coupled to the first semiconductor material GaSb of the channel. In addition, the second Heusler alloy may comprise a material selected from a group consisting of $Ni_xCu_{1-x}MnSb$, $Rh_xPd_{1-x}MnAl$, and $Rh_{2-x}PdMnGe$, coupled to the second material InAs of the channel.

In embodiments, for a MX2 transistor, the channel may include a MX2 material, where M is a transition metal Mo, W, or Ti, and X is a chalcogenide S or Se, while the first Heusler alloy for the source contact may comprise a material selected from a group consisting of $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, $MMnSb$, and $M_2MnIn$, where M includes a material selected from a group consisting of Co, Ni, Cu, Rh, Pd, and Pt.

In embodiments, for a junctionless nanowire transistor, the channel may comprise a nanowire, while the first Heusler alloy for the source contact may comprise a material selected from a group consisting of $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, $MMnSb$, and $M_2MnIn$, where M includes a material selected from a group consisting of Co, Ni, Cu, Rh, Pd, and Pt.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more dements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
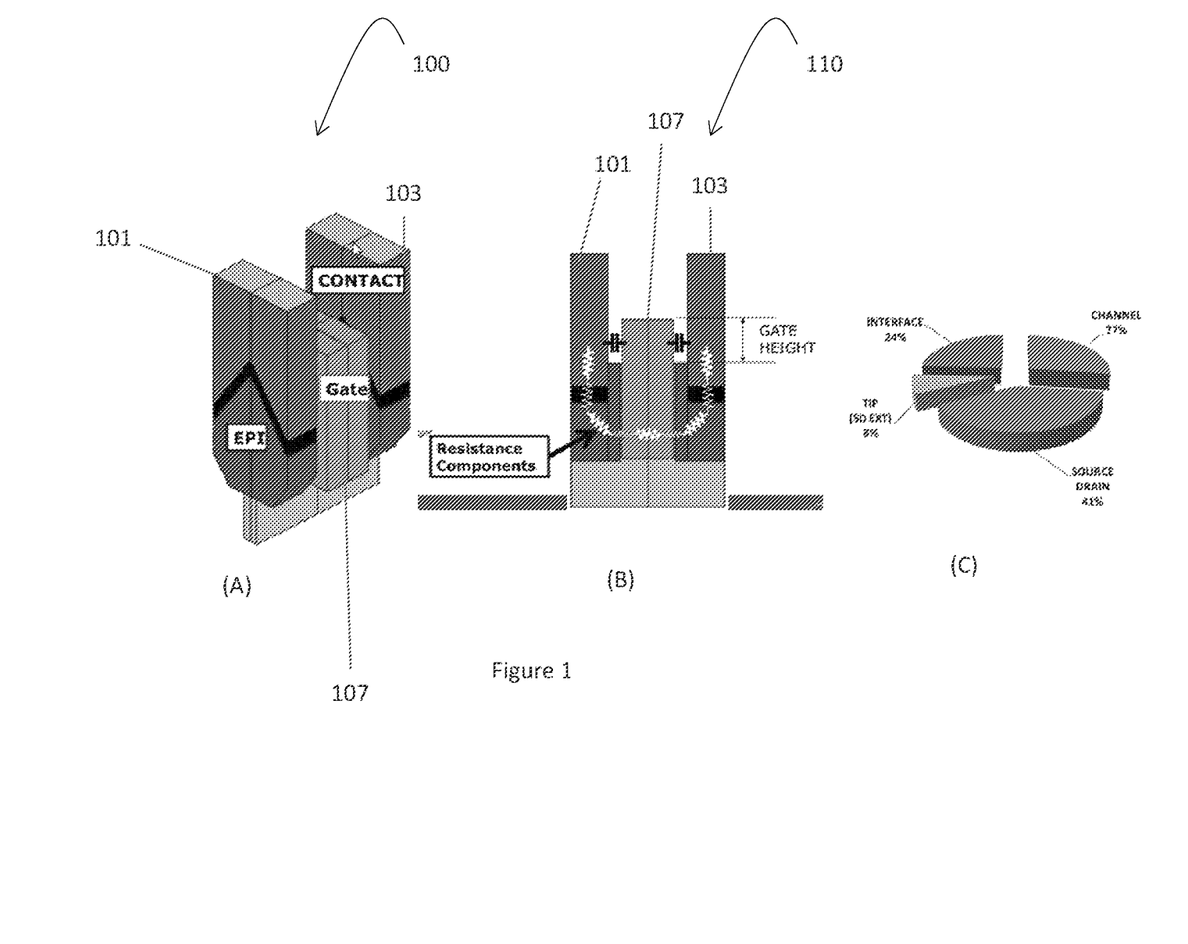
FIG. 1 demonstrates an impact of the source and drain contact resistances on the performance of a transistor, in accordance with some embodiments.

FIG. 1 demonstrates an impact of the source and drain contact resistances on the performance of a transistor, in accordance with some embodiments.

The field-effect transistor (FET) is a transistor that uses an electric field to control the shape and hence the electrical conductivity of a channel of one type of charge carrier in a semiconductor material. In embodiments, FET can be a junction FET, where the source/drain and channel for a FET may use opposite types of doping. As the device scales down, the short-channel effect may happen due to the depletion region across the channel. FETs are expected to have new gate architectures, channel materials and switching mechanisms in the near future. The trend in transistor scaling has already led to a change in gate structure from two dimensions to three, as used in fin FETs. Embodiments for transistors may include strained silicon transistors, III-V transistors, tunnel field-effect transistors (TFETs), dichalcogenide (MX2) transistors, junctionless nanowire transistors, and/or other types of transistors. While the device scaling has reduced the channel thickness in various kinds of FETs, the source and drain contact resistances may play a more significant role in the performance of scaled FETs.

FIG. 1 demonstrates an impact of the resistance of the source contact 101 and the resistance of the drain contact 103 for a three dimensional III-V transistor 100, in accordance with some embodiments. FIG. 1(A) illustrates a perspective view of a part of the three dimensional transistor 100 with a source contact 101, a drain contact 103, and a gate 107. FIG. 1(B) illustrates a cross-sectional side view of a circuit simulation model 110 of the components of the transistor 100 including the source contact 101, the drain contact 103, and the gate. The circuit simulation model 110 shows resistances provided by the components of the transistor 110 along a path between the source contact 101 and the drain contact 103, through the channel. FIG. 1(C) further illustrates a pie chart showing the relative resistances of various components of the transistor 100 as a proportion of an overall resistance of the transistor 100. As illustrated in FIG. 1(*iii*), the resistance of the source contact and the resistance of the drain contact may be about 41% of the overall resistance of the transistor 100, while the channel resistance may be about 27% of the overall resistance of the transistor. Hence solutions to reduce the source contact resistance and the drain contact resistance for various transistors will benefit many devices and systems.

Figure 2A:
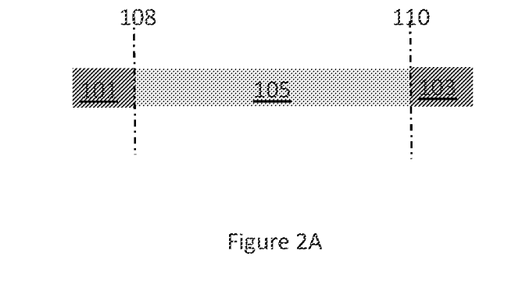
FIG. 2A schematically illustrates a cross-section side view of a source contact, a drain contact, and a channel of a transistor, in accordance with some embodiments.

FIG. 2A illustrates an embodiment including a channel 105 coupled to a source contact 101 and a drain contact 103 of a transistor. The channel 105 may include a first semiconductor material. Additionally, or alternatively, the channel 105 may include a second semiconductor material different from the first semiconductor material. In embodiments, the channel 105 may comprise Si(111), III-V materials, e.g., InGaAs, InGaAs nanowires, and/or InGaAs/InP/InAlAs/InGaAs core-multishell nanowires. In embodiments, the channel 105 may include material selected from a group consisting of GaAs, InGaAs, and XY, where X includes Ga or In, and Y includes a material selected from a group consisting of P, As, Sb, and their ordered alloys. In embodiments, the channel 105 may include a two-dimensional (2D) material selected from 2D metal di chalcogenide family. For example, the channel 105 may include a MX2 material, M may be a transition metal Mo, W, or Ti, and X may be a chalcogenide S or Se.

In embodiments, the source contact 101 may comprise a first Heusler alloy, and the drain contact 103 may comprise a second Heusler alloy, where the first Heusler alloy may be the same as the second Heusler alloy. Additionally and alternatively, in embodiments, the first Heusler alloy may be different from the second Heusler alloy.

The source contact 101 and the drain contact 103 may be coupled to the channel 105. The source contact 101 and the drain contact 103 may be formed by many different ways. In embodiments, the formation of metal alloys used as the source contact 101 and the drain contact 103 may be referred to as metal silicide. In embodiment, ferromagnetic Heusler-type alloys, including $Fe_3Si$ and $Fe_2MnSi$ thin films, may be formed by epitaxial growth on a channel material such as semiconductor Si and Ge, using low-temperature molecular beam epitaxy.

In embodiments, the connection between the channel 105, the source contact 101, and the drain contact 103 may merely be an example. Embodiments shown in FIG. 2A do not present physical limitation on the channel 105, the source contact 101, or the drain contact 103. The channel 105, the source contact 101, and/or the drain contact 103 can be of different shape and form, comprising different materials, and in various relative locations. The connection between the channel 105 and the source contact 101 may be a direct connection, or an indirect connection through one or more other components.

The first Heusler alloy for the source contact 101, and the second Heusler alloy for the drain contact 103 may include interpenetrating face-centered cubic (fcc) lattices with the chemical formula of $X_2YZ$ and XYZ, representing "full" and "half" Heusler alloys, respectively. In embodiments, X and Y may be transition metals and Z may be a main group element. The versatility of these materials may be due to the tunability of their electrical, magnetic, and optical properties by controlling their composition and stoichiometry. $Co_2YZ$ compounds, with Y=Fe or Mn and Z=Ga, Al, Si, or Ge, e.g., $Co_2FeSi$, $Co_2MnSi$, may be referred to as ferromagnetic full-Heulser alloys with Curie temperatures substantially above room temperature. For example, the magnetic properties of $Fe_{3-x}Mn_xSi$ may be tuned by controlling the Mn composition x.

In embodiments, there may be a first Schottky barrier of a first interface 108 between the channel 105 and the source contact 101, and a second Schottky barrier of a second interface 110 between the channel 105 and the drain contact 103. In embodiments, the first Schottky barrier may be controlled by a first work function of the first Heusler alloy, and the second Schottky barrier may be controlled by a second work function of the second Heusler alloy. In embodiments, the resistance of the source contact, and the resistance of the drain contact may be within a desirable range for an application when the first Schottky barrier and the second Schottky barrier may be negative, or smaller than a predetermined threshold. For example, in embodiments, the resistance of the source contact, and the resistance of the drain contact may be within a desirable range for a mobile application when the first Schottky barrier and the second Schottky barrier may be smaller than 0.4 eV.

Figure 2B:
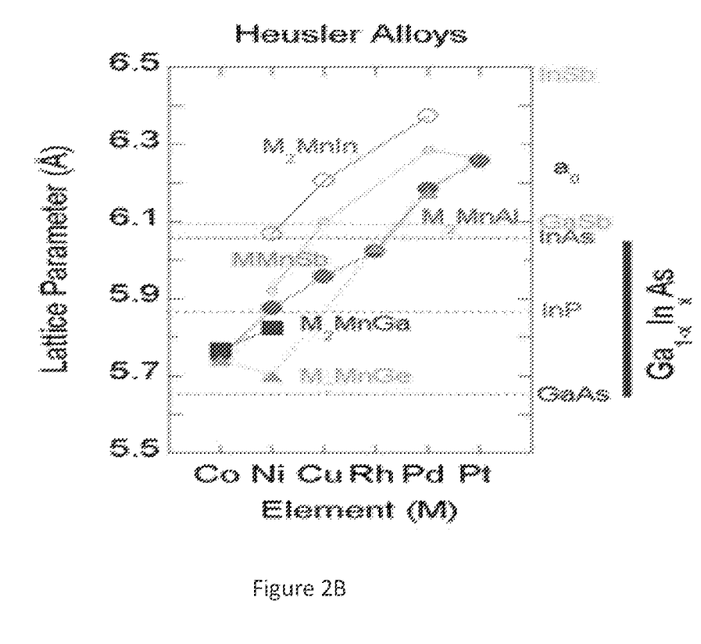
FIG. 2B illustrates the lattice parameter of various Heusler alloys compared with the lattice parameter of various III-V semiconductor materials, showing that the lattice parameter of a Heusler alloy may be matched to a lattice parameter of a semiconductor material within a predetermined threshold, in accordance with some embodiments.

FIG. 2B illustrates that a Heusler alloy may be lattice-matched to a semiconductor material within a predetermined threshold, hence reducing the resistance of a Heusler alloy source contact, and/or the resistance of a Heusler alloy drain contact. For example, the lattice parameter of some Heusler alloy, such as $M_2MnIn$, MMnSb, $M_2MnAl$, $M_2MnGa$, and $M_2MnGe$, may be controlled by the element M contained in the Heusler alloy, where the element M may include Co, Ni, Cu, Rh, Pd, and Pt. By choosing a right Heusler alloy, its lattice parameter may be a same or lattice-matched to a semiconductor material such as III-V material GaAs, InP, or InAs. In embodiments, a Heusler alloy may be lattice-matched to a semiconductor material within a predetermined threshold. For example, a difference between a lattice parameter of a Heusler alloy and a lattice parameter of a semiconductor material may be within 10%.

Figure 2C:
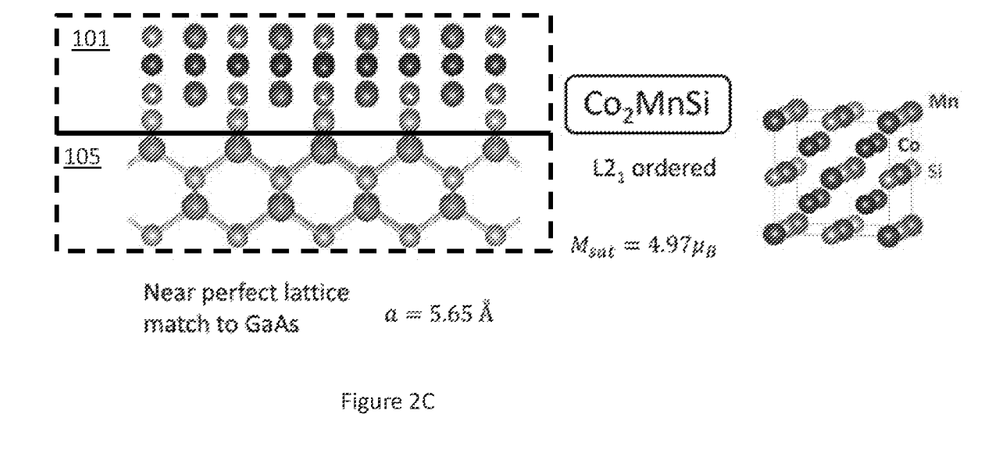
FIG. 2C illustrates the atomic arrangement of an interface between GasAs and Co3MnSi in an III-V transistor, in accordance with some embodiments.

FIG. 2C illustrates the atomic arrangement of an interface between GasAs and Co3MnSi in an III-V transistor. In more details, FIG. 2C illustrates that a Heusler alloy $Co_2MnSi$ as a source contact 101 may be near perfectly matched to a channel 105. In embodiments, the channel 105 may include GaAs with a lattice parameter 5.65 Å. On the other hand, the source contact 101 may include $Co_2MnSi$ having a lattice near perfectly matched with the channel material GaAs.

Figure 2D:
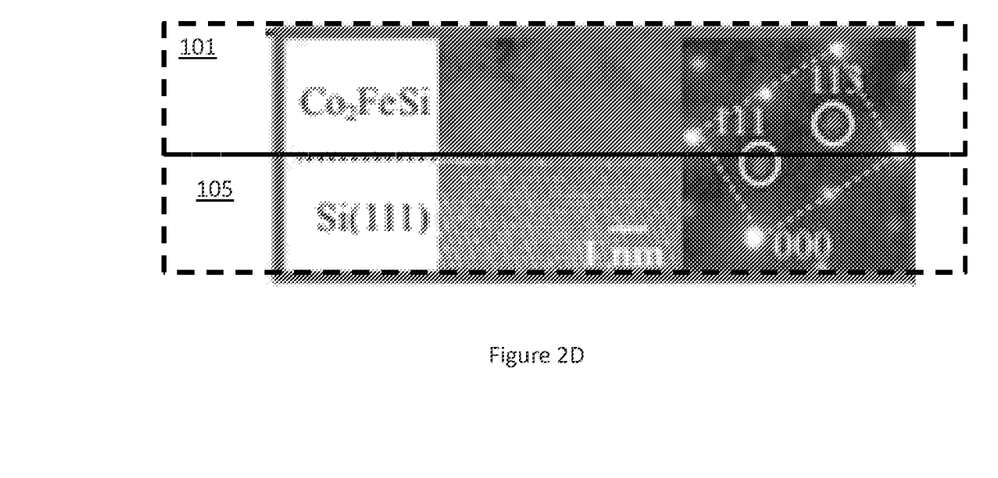
FIG. 2D illustrates the atomic arrangement of an interface between Si and Co2FeSi in silicon transistors, in accordance with some embodiments.

FIG. 2D illustrates the atomic arrangement of an interface between Si and Co2FeSi in silicon transistors. In more details, FIG. 2D illustrates that a Heusler alloy $Co_2FeSi$ as a source contact 101 may be near perfectly matched to the channel 105. In embodiments, the channel 105 may include Si(111). On the other hand, the source contact 101 may include $Co_2FeSi$ having a lattice near perfectly matched with the channel material Si(111).

FIGS. 3A-3F schematically illustrate cross-section side views and three-dimensional views of various transistors having Heusler alloy source and drain contacts, in accordance with some embodiments.

Figure 3A:
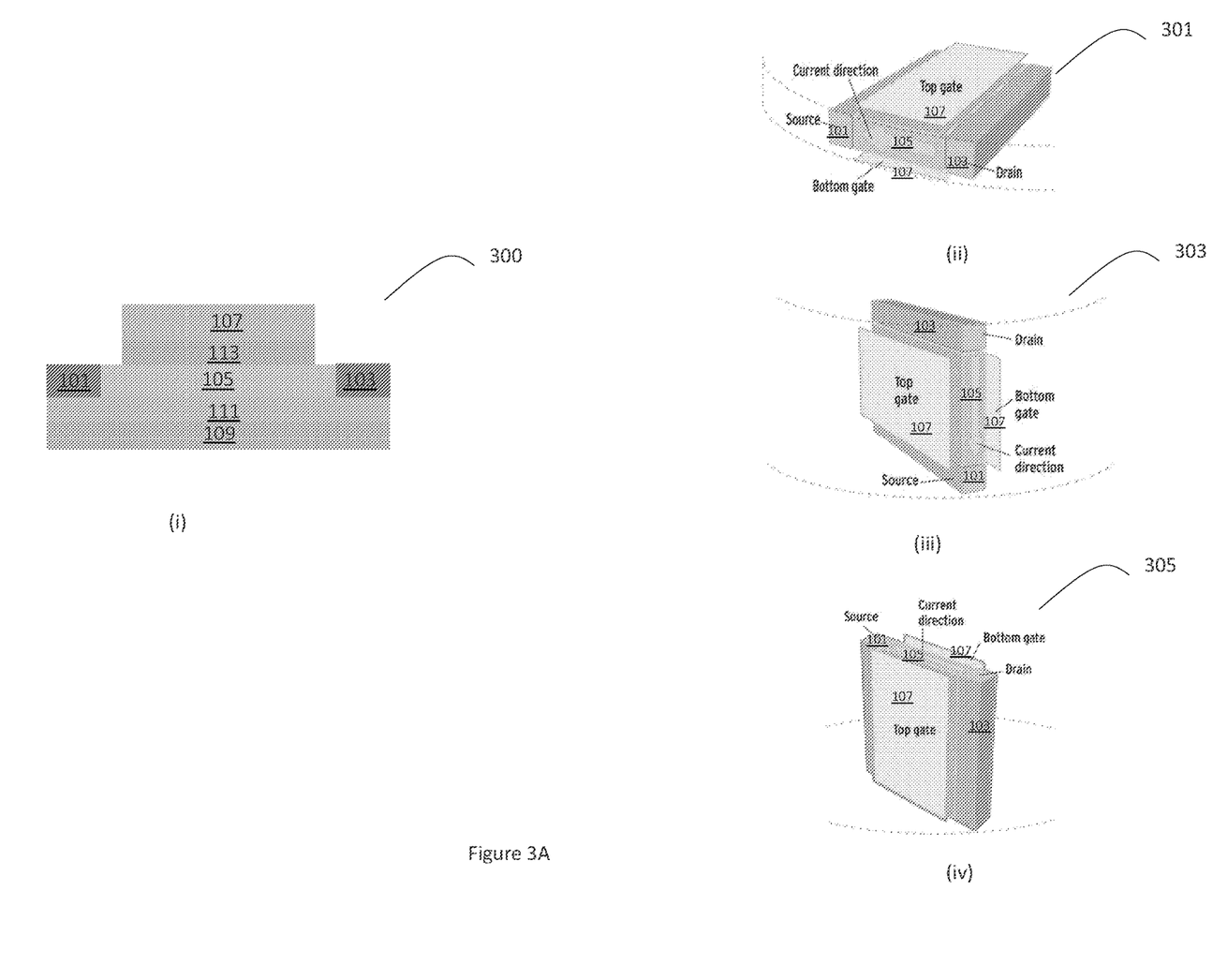
FIGS. 3A-3F schematically illustrate cross-section side views and three-dimensional views of various transistors having Heusler alloy source and drain contacts, in accordance with some embodiments.

FIG. 3A(i) illustrates a transistor 300 including a source contact 101, a drain contact 103, and a channel 105, which may be similar to the source contact 101, the drain contact 103, and the channel 105 as shown in FIG. 2A. In addition, the transistor 300 may also include a substrate 109, a buried oxide layer 111, a gate 107, and an insulator layer 113. In embodiments, the channel 105, the source contact 101, the drain contact 103, the substrate 109, the buried oxide layer 111, the gate 107, and the insulator layer 113 may merely be an example. Embodiments shown in FIG. 3A(i) do not present physical limitation on the components.

In embodiments, the transistor 300 may be a strained silicon transistor, an III-V transistor, a TFET, a MX2 transistor, and/or a junctionless nanowire transistor. Additionally and alternatively, in embodiments, the transistor 300 may have a planar architecture, a fin architecture, a surrounding-gate architecture, a vertically oriented transistor, or other three dimensional architecture.

FIGS. 3A(ii)-(iv) illustrate multi-gate transistors 301, 303, and 305, including a source contact 101, a drain contact 103, and a channel 105, which may be similar to the source contact 101, the drain contact 103, and the channel 105 as shown in FIG. 2A. In addition, the transistors 301, 303, and 305 may also include multiple gates 107. As shown in FIGS. 3A(ii)-(iv), the multiple gates 107 may be placed in planar direction (FIG. 3A(ii)), vertical direction (FIG. 3A(iii)), and/or as FIN (FIG. 3A(iv)). Embodiments shown in FIGS. 3A(ii)-(iv) do not present physical limitation on the components.

Figure 3B:
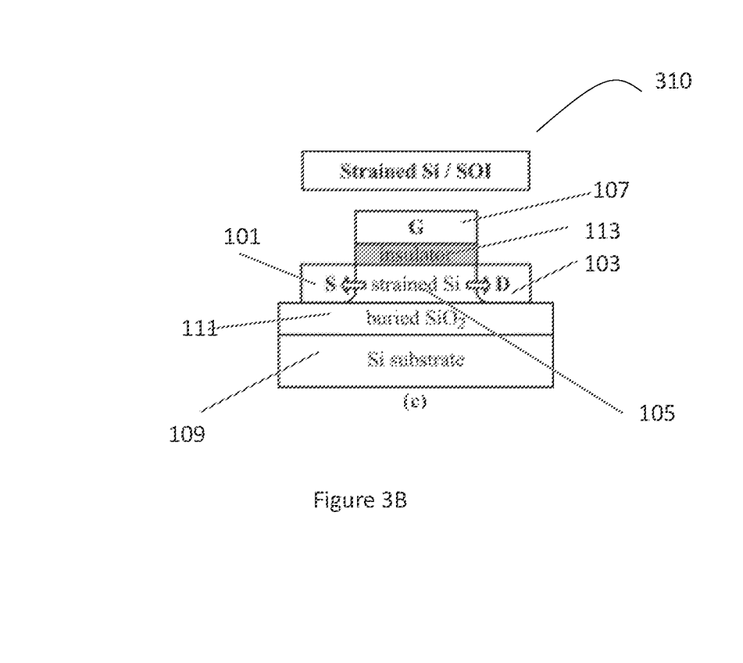

FIG. 3B schematically illustrates a cross-section side view of a strained silicon transistor 310 having a source contact 101, a drain contact 103, and a strained silicon channel 105, in accordance with some embodiments. The strained silicon transistor 310 may be an example of the transistor 300 shown in FIG. 3A. For example, the strained silicon transistor 310 may also include a substrate 109, a buried oxide layer 111, and a gate 107. In some embodiments, there may be an insulator layer 113 below the gate 107 and above the strained silicon channel 105.

In embodiments, the strained silicon channel 105 may comprise Si(111), the source contact 101, and the drain contact 103 may comprise a Heusler alloy $Co_2FeSi$, as illustrated in FIG. 2D. Additionally and alternatively, the strained silicon channel 105 may comprise Si(111), the source contact 101, and the drain contact 103 may comprise a Heusler alloy $Fe_{3-x}Mn_xSi$, as illustrated in FIG. 2E. In embodiments, when $Fe_{3-x}Mn_xSi$ may be used as the source contact 101, and/or the drain contact 103, the lattice property of $Fe_{3-x}Mn_xSi$ may be determined by a value of x indicating a Mn composition, to match the lattice of Si(111) of the channel 105.

Figure 3C:
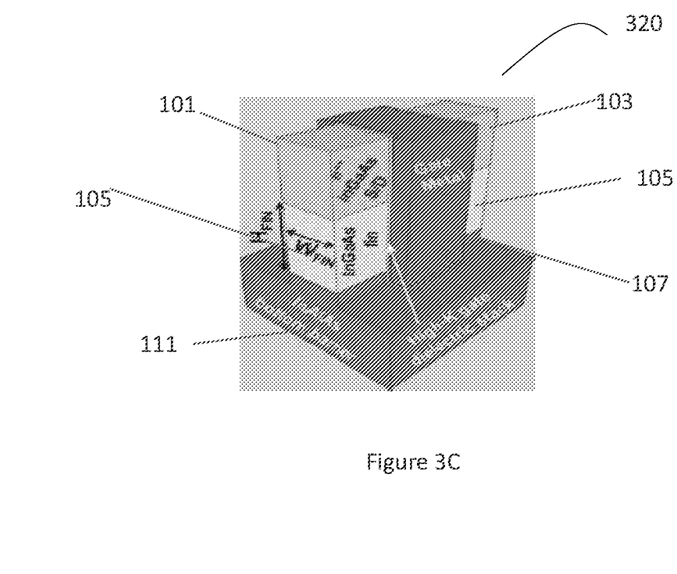

FIG. 3C schematically illustrates a three dimensional view of a tri-gate InGaAs III-V transistor 320 having a source contact 101, a drain contact 103, and a channel 105, in accordance with some embodiments. The transistor 320 may be an example of the transistor 300 shown in FIG. 3A. For example, the III-V transistor 320 may also include a buried oxide layer 111 and a gate 107. The III-V transistor 320 may further include a substrate, not shown. In embodiments, the substrate may include MgO, MgAlO, $AL_2O_3$, STO, $DyScO_3$, $NbScO_3$, or NbSTO.

In embodiments, the channel 105 may comprise GaAs, InGaAs, or XY, where X may include Ga or In, and Y may include P, As, Sb, or their ordered alloys.

In embodiments, the first Heusler alloy for the source contact 101 may comprise $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M may include Co, Ni, Cu, Rh, Pd, or Pt.

In embodiments, the second Heusler alloy for the drain contact 103 may comprise $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M may include Co, Ni, Cu, Rh, Pd, or Pt.

In some embodiments, the channel 105 of the III-V transistor 320 may comprise GaAs, the first Heusler alloy for the source contact 101 may comprise $Co_2CrFeAl$ or $Co_2MnSi$, and the second Heusler alloy for the drain contact 103 may comprise $Co_2CrFeAl$ or $Co_2MnSi$.

Figure 3D:
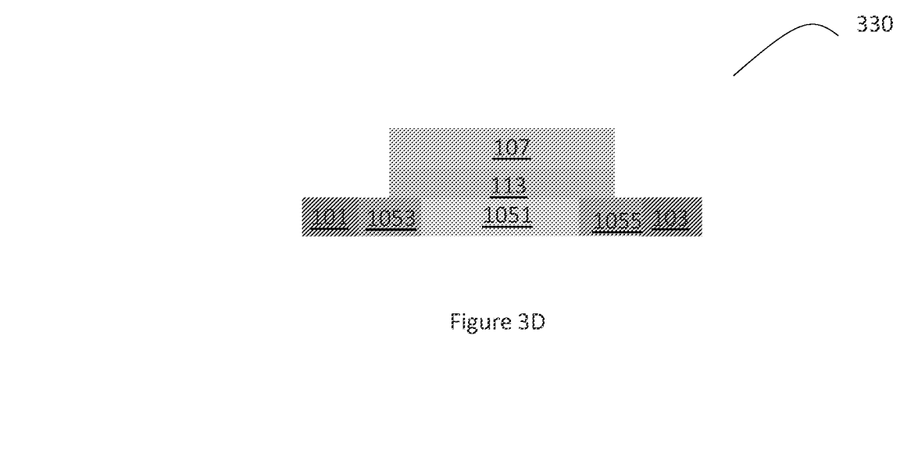

FIG. 3D schematically illustrates a cross-section side view of a TFET 330 having a source contact 101, a drain contact 103, and a channel 105, in accordance with some embodiments. The TFET 330 may be an example of the transistor 300 shown in FIG. 3A. For example, the TFET 330 may also include a gate 107 and an insulator layer 113. The TFET 330 may further include a substrate, not shown. In embodiments, the channel 105 of the TFET 330 may include a first material 1053 comprising GaSb which may be p doped, a second material 1055 comprising InAs which may be n doped, and a third material 1051 i-InAs.

In embodiments, the TFET 330 may include a first Heusler alloy source contact 101 comprising a material selected from a group consisting of $Ni_2MnIn$, CuMnSb, $Rh_xPd_{1-x}MnAl$, and $Rh_{2-x}PdMnGe$, coupled to the first material 1053 comprising GaSb. In embodiments, the Mn for the first Heusler alloy source contact 101 may be substituted by Cr, Co, Fe, 3d, 4d, or 5d series of metals.

In embodiments, the TFET 330 may include a second Heusler alloy as a drain contact 103 comprising a material selected from a group consisting of $Ni_xCu_{1-x}MnSb$, $Rh_xPd_{1-x}MnAl$, and $Rh_{2-x}PdMnGe$, coupled to the second material 1055 comprising InAs. In embodiments, the Mn for the second Heusler alloy as the drain contact 103 may be substituted by Cr, Co, Fe, 3d, 4d, or 5d series of metals.

Figure 3E:
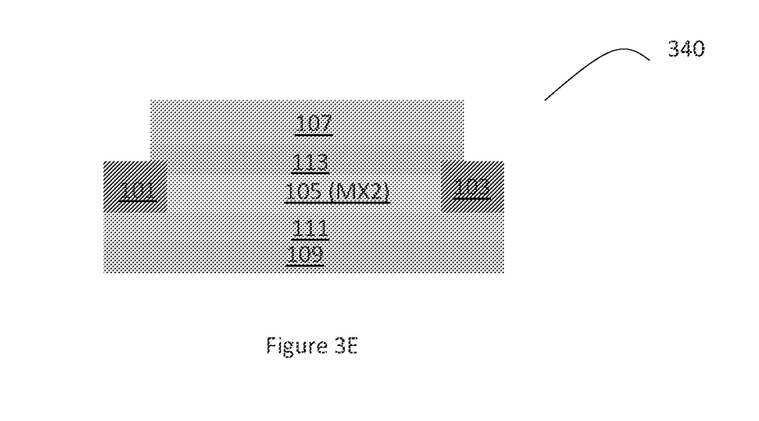

FIG. 3E schematically illustrates a cross-section side view of a MX2 transistor 340 having a source contact 101, a drain contact 103, and a channel 105, in accordance with some embodiments. The MX2 transistor 340 may be an example of the transistor 300 shown in FIG. 3A. For example, the MX2 transistor 340 may also include a gate 107, an insulator layer 113, a substrate 109, and a buried oxide layer 111. In embodiments, the channel 105 of the MX2 transistor 340 may include a two-dimensional (2D) material selected from 2D metal di chalcogenide family. In embodiments, the channel 105 of the MX2 transistor 340 may comprise a MX2 material, M is a transition metal Mo, W, or Ti, and X is a chalcogenide S or Se.

Figure 3F:
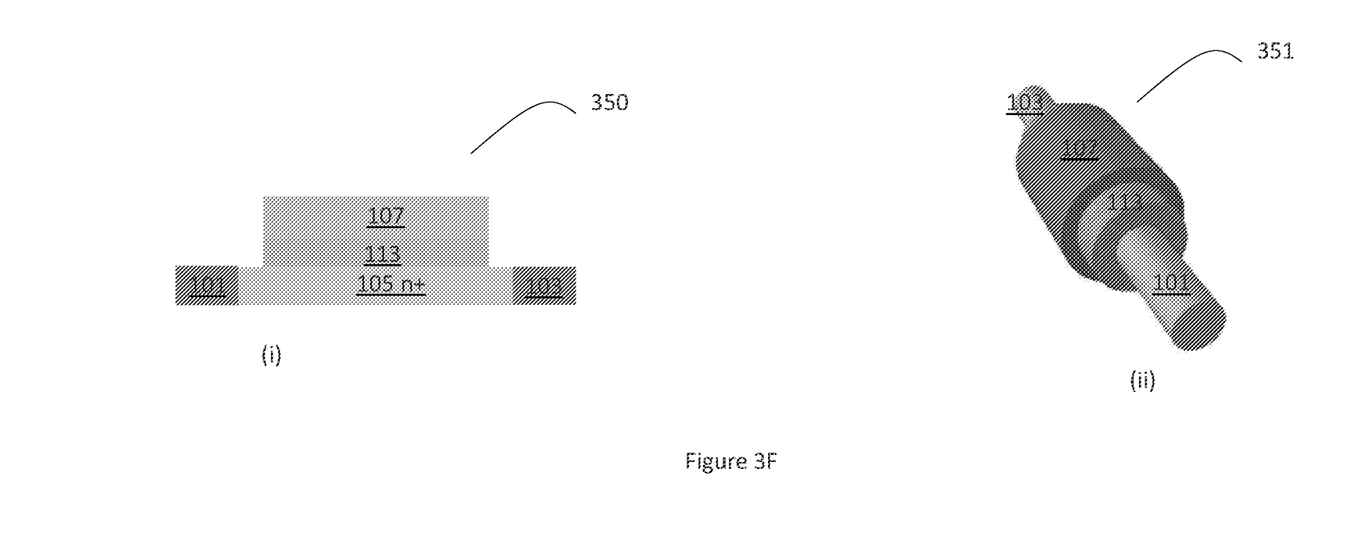

FIG. 3F(i) schematically illustrates a cross-section side view of a junctionless nanowire transistor 350 having a source contact 101, a drain contact 103, and a channel 105, in accordance with some embodiments. Similarly, FIG. 3F(ii) schematically illustrates a three-dimensional view of a junctionless nanowire transistor 351 having a source contact 101, a drain contact 103 while a channel not shown, in accordance with some embodiments.

The junctionless nanowire transistors 350 and 351 may be examples of the transistor 300 shown in FIG. 3A. For example, the junctionless nanowire transistors 350 and 351 may also include a gate 107 and an insulator layer 113. In embodiments, the junctionless nanowire transistors 350 and 351 may be a nanowire-based transistor that has no gate junction. Gate junctions may be difficult to fabricate, and may be a significant source of current leakage leading to a waste of power and heat. Eliminating gate junctions may hold the promise of cheaper and denser microchips. In embodiments, the junctionless nanowire transistors 350 and 351 may use a simple nanowire of silicon surrounded by an electrically isolated "wedding ring" that acts to gate the flow of electrons through the wire. The nanowire material for the channel 105 may be heavily n-doped, making it an excellent conductor. On the other hand, the gate 107, comprising silicon, may be heavily p-doped; and its presence may deplete the underlying silicon nanowire thereby preventing carrier flow past the gate.

Figure 4A:
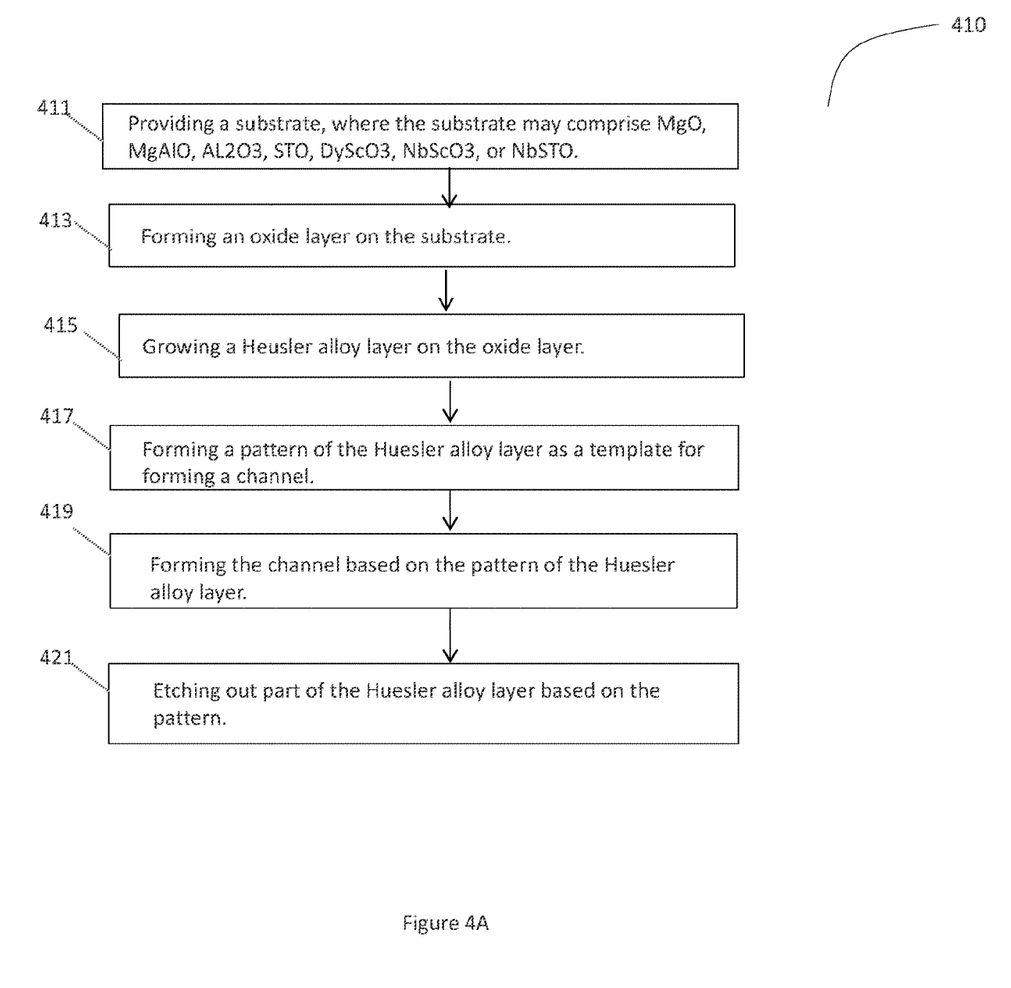
Figure 4B:
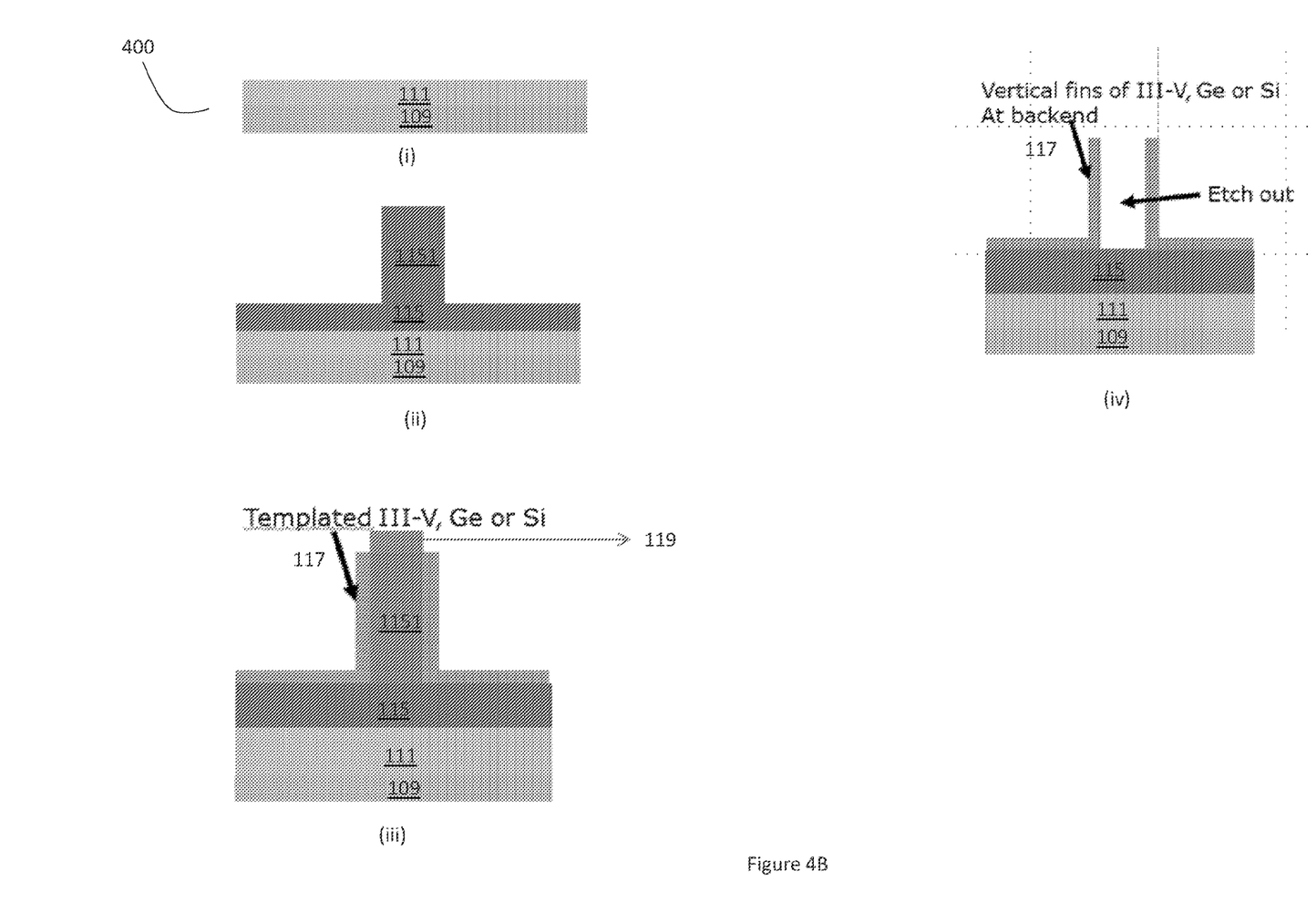
FIG. 4B illustrates various stages of the device following the process of FIG. 4A, in accordance with some embodiments.

FIG. 4A schematically illustrates a process for forming a channel based on a Heusler metallic layer as a template, while FIG. 4B illustrates various stages of the device following the process of FIG. 4A, in accordance with some embodiments.

FIG. 4A illustrates a process 410 of forming a device, such as the devices illustrated in FIG. 3A-3F.

At block 411, the process 410 may include providing a substrate. For example, in embodiment, the substrate 109 may be provided as illustrated in FIG. 4B(i). In embodiments, the substrate may comprise MgO, MgAlO, $AL_2O_3$, STO, $DyScO_3$, $NbScO_3$, or NbSTO. The substrate 109 shown in FIG. 4B(i) may be a same or similar substrate 109 shown in FIG. 3A.

At block 413, the process 410 may include forming an oxide layer on the substrate. For example, in embodiment, the oxide layer 111 may be formed as illustrated in FIG. 4B(i). The oxide layer 111 shown in FIG. 4B may be a same or similar oxide layer 111 shown in FIG. 3A.

At block 415, the process 410 may include growing a Heusler alloy layer on the oxide layer. For example, in embodiment, the Heusler alloy layer 115 may be formed over the oxide layer 111, as illustrated in FIG. 4B(ii). The Heusler alloy layer 115 shown in FIG. 4B(ii) may be a same or similar as the source contact 101 or the drain contact 103 shown in FIG. 3A. In embodiments, the Heusler alloy layer 115 may comprise a material selected from a group consisting of $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, and $M_2MnIn$, where M may include a material selected from a group consisting of Co, Ni, Cu, Rh, Pd, and Pt.

At block 417, the process 410 may include forming a pattern of the Heusler alloy layer as a template for forming a channel. For example, in embodiment, a pattern 1151 may be formed as a part of the Heusler alloy layer 115, as illustrated in FIG. 4B(ii).

At block 419, the process 410 may include forming the channel based on the pattern of the Heusler alloy layer. For example, in embodiment, the channel 117 may be formed based on the pattern 1151 of the Heusler alloy layer 115, as illustrated in FIG. 4B(iii). In embodiments, the pattern 1151 may be covered by photoresist material 119 to form the channel 117. The channel 117 shown in FIG. 4B(iii) may be a same or similar as the channel 105 shown in FIG. 3A. In embodiments, the channel 117 may comprise a material selected from a group consisting of GaAs, InGaAs, and XY, where X may include Ga or In, and Y may include a material selected from a group consisting of P, As, Sb, and their ordered alloys.

At block 421, the process 410 may include etching out part of the Heusler alloy layer based on the pattern. For example, in embodiment, the part of the pattern 1151 used to form the channel 117 may be etched away, as illustrated in FIG. 4B(iv). The photoresist material 119 may be removed first in the etching process.

In addition, other parts, such as a gate, or an insulator layer may be formed after the channel 117 is formed. The remaining process is not shown in FIG. 4A or FIG. 4B.

Figure 5:
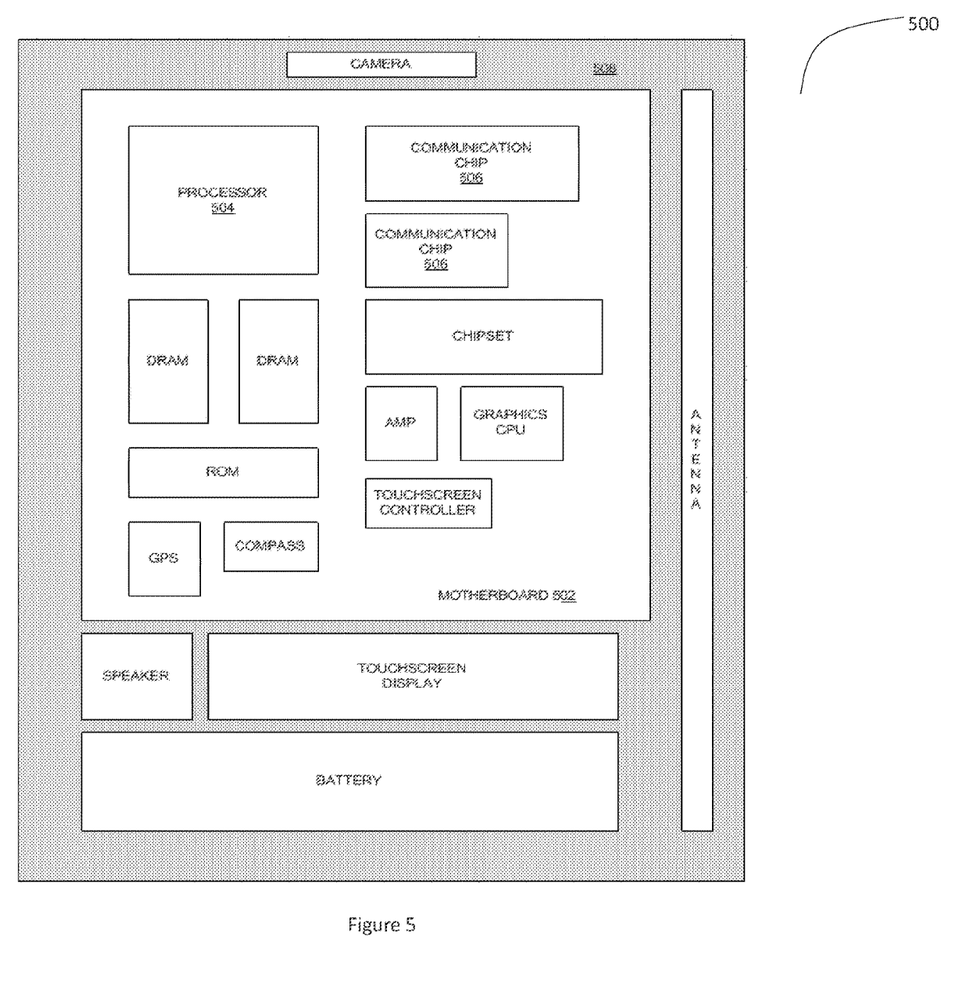
FIG. 5 schematically illustrates an example system that may include a transistor with Heusler alloy source and drain contacts as described herein, in accordance with some embodiments.

FIG. 5 schematically illustrates an example system (e.g., computing device 500) that may include a transistor with Heusler alloys source and drain contacts as described herein, in accordance with some embodiments.

In embodiments, the computing device 500 may include a transistor (e.g., transistors 300, 310, 320, 330, 340, and 350, and/or a transistor fabricated using the process 410) as described herein, in accordance with some embodiments. Components of the computing device 500 may be housed in an enclosure (e.g., housing 508). The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GFS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

The processor 504 of the computing device 500 may include various transistors as described herein (e.g., transistors 300, 310, 320, 330, 340, and 350, and/or a transistor fabricated using the process 410). The term "processor" may refer to any device or portion of a device that processes electronic data from registers and/or memory to transform that electronic data into other electronic data that may be stored in registers and/or memory.

The communication chip 506 may also include various transistors as described herein (e.g., transistors 300, 310, 320, 330, 340, and 350, and/or a transistor fabricated using the process 410). In further implementations, another component (e.g., memory device or other integrated circuit device) housed within the computing device 500 may include various transistors as described herein (e.g., transistors 300, 310, 320, 330, 340, and 350, and/or a transistor fabricated using the process 410).

In various implementations, the computing device 500 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some non-limiting Examples are provided below.

Example 1 may include a semiconductor device, comprising: a channel including a first semiconductor material; a source contact coupled to the channel, the source contact comprising a first Heusler alloy; and a drain contact coupled to the channel, the drain contact comprising a second Heusler alloy.

Example 2 may include the device of example 1 and/or some other examples herein, wherein the first Heusler alloy may be lattice-matched to the first semiconductor material within a first predetermined threshold.

Example 3 may include the device of example 1 and/or some other examples herein, wherein the second Heusler alloy may be lattice-matched to the first semiconductor material within a second predetermined threshold.

Example 4 may include the device of example 2 and/or some other examples herein, wherein the first predetermined threshold is 10%.

Example 5 may include the device of example 1 and/or some other examples herein, wherein a first Schottky barrier between the channel and the source contact, and a second Schottky barrier between the channel and the drain contact are negative or smaller than a third predetermined threshold.

Example 6 may include the device of example 5 and/or some other examples herein, wherein the third predetermined threshold is 0.4 eV.

Example 7 may include the device of example 5 and/or some other examples herein, wherein the first Schottky barrier is controlled by a first work function of the first Heusler alloy, and the second Schottky barrier is controlled by a second work function of the second Heusler alloy.

Example 8 may include the device of example 1 and/or some other examples herein, wherein the device is a strained silicon transistor, the first semiconductor material comprises Si(111), and the first Heusler alloy comprises $Co_2FeSi$.

Example 9 may include the device of example 1 and/or some other examples herein, wherein the device is a strained silicon transistor, the first semiconductor material comprises Si(111), and the first Heusler alloy comprises $Fe_{3-x}Mn_xSi$ Example 10 may include the device of example 1 and/or some other examples herein, wherein the device is an III-V transistor, the first semiconductor material comprises GaAs, InGaAs, or XY, where X includes Ga or In, and Y includes P, As, Sb, or ordered alloys of P, As, or Sb.

Example 11 may include the device of example 10 and/or some other examples herein, wherein the first Heusler alloy comprises $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M includes Co, Ni, Cu, Rh, Pd, or Pt.

Example 12 may include the device of example 10 and/or some other examples herein, wherein the second Heusler alloy comprises $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M includes Co, Ni, Cu, Rh, Pd, or Pt.

Example 13 may include the device of example 1 and/or some other examples herein, wherein the device is an III-V transistor, the first semiconductor material comprises GaAs, the first Heusler alloy comprises $Co_2CrFeAl$ or $Co_2MnSi$, and the second Heusler alloy comprises $Co_2CrFeAl$ or $Co_2MnSi$.

Example 14 may include the device of example 1 and/or some other examples herein, wherein the device is an III-V transistor, and the device further comprises a substrate including MgO, MgAlO, $AL_2O_3$, STO, $DyScO_3$, $NbScO_3$, or NbSTO.

Example 15 may include the device of example 1 and/or some other examples herein, wherein the device is a tunnel field-effect transistor (TFET), wherein the first Heusler alloy comprises $Ni_2MnIn$, CuMnSb, $Rh_xPd_{1-x}MnAl$, or $Rh_{2-x}PdMnGe$, wherein the first Heusler alloy is coupled to the first semiconductor material, the first semiconductor material comprises GaSb, and Y is Mn, Cr, Co, Fe, or a metal of 3d, 4d, or 5d series.

Example 16 may include the device of example 1 and/or some other examples herein, wherein the device is a TFET, wherein the second Heusler alloy comprises $Ni_xCu_{1-x}MnSb$, $Rh_xPd_{1-x}MnAl$, or $Rh_{2-x}PdMnGe$ coupled to a second material within the channel, wherein the second material comprises InAs, and Y is Mn, Cr, Co, Fe, or a metal of 3d, 4d, or 5d series.

Example 17 may include the device of example 1 and/or some other examples herein, wherein the device is a dichalcogenide (MX2) transistor, and wherein the first semiconductor material comprises a two-dimensional (2D) dichalcogenide material.

Example 18 may include the device of example 1 and/or some other examples herein, wherein the device is a MX2 transistor, wherein the first semiconductor material comprises a MX2 material, wherein M is Mo, W, or Ti, and wherein X is S or Se.

Example 19 may include the device of example 1 and/or some other examples herein, wherein the device is a junctionless nanowire transistor, and wherein the first semiconductor material comprises a nanowire.

Example 20 may include electrical system, comprising: a memory device, a display, and a processor coupled to the memory device and the display, the processor including a transistor, and the transistor including: a channel including a first semiconductor material; a source contact coupled to the channel, the source contact comprising a first Heusler alloy; and a drain contact coupled to the channel, the drain contact comprising a second Heusler alloy.

Example 21 may include the system of example 20 and/or some other examples herein, wherein the first Heusler alloy is lattice-matched to the first semiconductor material within a first predetermined threshold.

Example 22 may include the system of example 20 and/or some other examples herein, wherein the second Heusler alloy is lattice-matched to the first semiconductor material within a second predetermined threshold.

Example 23 may include the system of example 21 and/or some other examples herein, wherein the first predetermined threshold is 10%.

Example 24 may include the system of example 20 and/or some other examples herein, wherein a first Schottky barrier between the channel and the source contact, and a second Schottky barrier between the channel and the drain contact are negative, or smaller than a third predetermined threshold.

Example 25 may include the system of example 24 and/or some other examples herein, wherein the third predetermined threshold is 0.4 eV.

Example 26 may include the system of example 24 and/or some other examples herein, wherein the first Schottky barrier is controlled by a first work function of the first Heusler alloy, and the second Schottky barrier is controlled by a second work function of the second Heusler alloy.

Example 27 may include the system of example 20 and/or some other examples herein, wherein the transistor is a strained silicon transistor, the first semiconductor material comprises Si(111), and the first Heusler alloy comprises $Co_2FeSi$.

Example 28 may include the system of example 20 and/or some other examples herein, wherein the transistor is a strained silicon transistor, the first semiconductor material comprises Si(111), and the first Heusler alloy comprises $Fe_{3-x}MnxSi$.

Example 29 may include the system of example 20 and/or some other examples herein, wherein the transistor is an III-V transistor, the first semiconductor material comprises GaAs, InGaAs, or XY, where X includes Ga or In, and Y includes P, As, Sb, or ordered alloys of P, As, or Sb.

Example 30 may include the system of example 29 and/or some other examples herein, wherein the first Heusler alloy comprises $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M includes Co, Ni, Cu, Rh, Pd, or Pt.

Example 31 may include the system of example 29 and/or some other examples herein, wherein the second Heusler alloy comprises $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M includes Co, Ni, Cu, Rh, Pd, or Pt.

Example 32 may include the system of example 20 and/or some other examples herein, wherein the transistor is an III-V transistor, the first semiconductor material comprises GaAs, the first Heusler alloy comprises $Co_2CrFeAl$ or $Co_2MnSi$, and the second Heusler alloy comprises $Co_2CrFeAl$ or $Co_2MnSi$.

Example 33 may include the system of example 20 and/or some other examples herein, wherein the transistor is an III-V transistor, and the transistor further comprises a substrate including MgO, MgAlO, $AL_2O_3$, STO, $DyScO_3$, $NbScO_3$, or NbSTO.

Example 34 may include the system of example 20 and/or some other examples herein, wherein the transistor is a tunnel field-effect transistor (TFET), wherein the first Heusler alloy comprises $Ni_2MnIn$, CuMnSb, $Rh_xPd_{1-x}MnAl$, or $Rh_{2-x}PdMnGe$, wherein the first Heusler alloy is coupled to the first semiconductor material, the first semiconductor material comprises GaSb, and is Mn, Cr, Co, Fe, or a metal of 3d, 4d, or 5d series.

Example 35 may include the system of example 20 and/or some other examples herein, wherein the transistor is a TFET, wherein the second Heusler alloy comprises $Ni_xCu_{1-x}MnSb$, $Rh_xPd_{1-x}MnAl$, or $Rh_{2-x}PdMnGe$ coupled to a second material within the channel, wherein the second material comprises InAs, and is Mn, Cr, Co, Fe, or a metal of 3d, 4d, or 5d series.

Example 36 may include the system of example 20 and/or some other examples herein, wherein the transistor is a dichalcogenide (MX2) transistor, and wherein the first semiconductor material comprises a two-dimensional (2D) dichalcogenide material.

Example 37 may include the system of example 20 and/or some other examples herein, wherein the transistor is a MX2 transistor, wherein the first semiconductor material comprises a MX2 material, wherein M is Mo, W, or Ti, and wherein X is S or Se.

Example 38 may include the system of example 20 and/or some other examples herein, wherein the transistor is a junctionless nanowire transistor, and wherein the first semiconductor material comprises a nanowire.

Example 39 may include a method for forming a semiconductor device, the method comprising:
providing a substrate;
forming an oxide layer on the substrate;
growing a Heusler alloy layer on the oxide layer;
forming a pattern of the Heusler alloy layer;
forming a channel based on the pattern of the Heusler alloy layer; and
etching out part of the Heusler alloy layer based on the pattern.

Example 40 may include the method of example 39 and/or some other examples herein, wherein the substrate comprises MgO, MgAlO, $AL_2O_3$, STO, $DyScO_3$, $NbScO_3$, or NbSTO.

Example 41 may include the method of example 39 and/or some other examples herein, wherein the channel comprises GaAs, InGaAs, or XY, where X includes Ga or In, and Y includes P, As, Sb, or ordered alloys of P, As, Sb.

Example 42 may include the method of example 39 and/or some other examples herein, wherein the Heusler alloy layer comprises $Co_2FeSi$, $Co_2FeSiGe$, $Co_2FeGeGa$, $Mn_3Ga$, $Mn_3Ge$, $Mn_3GeGa$, $Fe_{3-x}MnSi$, $M_2MnGe$, $M_2MnGa$, $M_2MnAl$, MMnSb, or $M_2MnIn$, where M includes Co, Ni, Cu, Rh, Pd, or Pt.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a channel including a first semiconductor material;
   a source contact coupled to the channel, the source contact comprising a first Heusler alloy and forming a first Schottky barrier; and
   a drain contact coupled to the channel, the drain contact comprising a second Heusler alloy and forming a second Schottky barrier; and
   wherein a resistance of the source contact and a resistance of the drain contact are maintained within a range, the range based on the first Schottky barrier and the second Schottky barrier being less than 0.4 eV.

2. The device of claim 1, wherein the first Heusler alloy is lattice-matched to the first semiconductor material within a first predetermined threshold to maintain source contact and drain contact resistances within a range.

3. The device of claim 1, wherein the device is a strained silicon transistor, the first semiconductor material comprises Si (111), and the first Heusler alloy comprises $Co_2FeSi$.

4. The device of claim 1, wherein the device is an III-V transistor, the first semiconductor material comprises GaAs, InGaAs, or XY, where X includes Ga or In, and Y includes P, As, Sb, or ordered alloys of P, As, or Sb.

5. The device of claim 1, wherein the device is an III-V transistor, the first semiconductor material comprises GaAs, the first Heusler alloy comprises $Co_2CrFeAl$ or $Co_2MnSi$, and the second Heusler alloy comprises $Co_2CrFeAl$ or $Co_2MnSi$.

6. The device of claim 1, wherein the device is a tunnel field-effect transistor (TFET), wherein the first Heusler alloy comprises $Ni_2MnIn$, CuMnSb, $Rh_xPd_{1-x}MnAl$, or $Rh_{2-x}PdMnGe$, wherein the first Heusler alloy is coupled to the first semiconductor material, the first semiconductor material comprises GaSb, and Y is Mn, Cr, Co, Fe, or a metal of 3d, 4d, or 5d series.

7. The device of claim 1, wherein the device is a TFET, wherein the second Heusler alloy comprises $Ni_xCu_{1-x}MnSb$, $Rh_xPd_{1-x}MnAl$, or $Rh_{2-x}PdMnGe$ coupled to a second material within the channel, wherein the second material comprises InAs, and Y is Mn, Cr, Co, Fe, or a metal of 3d, 4d, or 5d series.

8. The device of claim 1, wherein the device is a dichalcogenide (MX2) transistor, and wherein the first semiconductor material comprises a two-dimensional (2D) dichalcogenide material.

9. The device of claim 1, wherein the device is a MX2 transistor, wherein the first semiconductor material comprises a MX2 material, wherein M is Mo, W, or Ti, and wherein X is S or Se.

10. The device of claim 1, wherein the device is a junctionless nanowire transistor, and wherein the first semiconductor material comprises a nanowire.

11. An electrical system comprising:
    a memory device,
    a display, and
    a processor coupled to the memory device and the display, the processor including a transistor, and the transistor including:
    a channel including a first semiconductor material;
    a source contact coupled to the channel, the source contact comprising a first Heusler alloy and forming a first Schottky barrier; and
    a drain contact coupled to the channel, the drain contact comprising a second Heusler alloy and forming a second Schottky barrier; and
    wherein a resistance of the source contact and a resistance of the drain contact are maintained within a range, the range based on the first Schottky barrier and the second Schottky barrier being less than 0.4 eV.

12. The system of claim 11, wherein the first Heusler alloy is lattice-matched to the first semiconductor material within a first predetermined threshold to maintain source contact and drain contact resistances within a range.

13. The system of claim 12, wherein the first predetermined threshold is 10%, to represent a difference between a lattice parameter of the first Heusler alloy and a lattice parameter of the first semiconductor material when the first Heusler alloy and the first semiconductor material are lattice-matched.

14. The system of claim 11, wherein the transistor is a strained silicon transistor, the first semiconductor material comprises Si (111), and the first Heusler alloy comprises $Fe_{3-x}MnxSi$.

15. The system of claim 11, wherein the transistor is an III-V transistor, the first semiconductor material comprises GaAs, InGaAs, or XY, where X includes Ga or In, and Y includes P, As, Sb, or ordered alloys of P, As, or Sb.

16. The system of claim 11, wherein the transistor is an III-V transistor, the first semiconductor material comprises GaAs, the first Heusler alloy comprises $Co_2CrFeAl$ or $Co_2MnSi$, and the second Heusler alloy comprises $Co_2CrFeAl$ or $Co_2MnSi$.

17. The system of claim 11, wherein the transistor is a tunnel field-effect transistor (TFET), wherein the first Heusler alloy comprises $Ni_2MnIn$, CuMnSb, $Rh_xPd_{1-x}MnAl$, or $Rh_{2-x}PdMnGe$, wherein the first Heusler alloy is coupled to the first semiconductor material, the first semiconductor material comprises GaSb, and Y is Mn, Cr, Co, Fe, or a metal of 3d, 4d, or 5d series.

18. The system of claim 11, wherein the transistor is a TFET, wherein the second Heusler alloy comprises $Ni_xCu_{1-x}MnSb$, $Rh_xPd_{1-x}MnAl$, or $Rh_{2-x}PdMnGe$ coupled to a second material within the channel, wherein the second material comprises InAs, and Y is Mn, Cr, Co, Fe, or a metal of 3d, 4d, or 5d series.

19. The system of claim 11, wherein the transistor is a dichalcogenide (MX2) transistor, and wherein the first semiconductor material comprises a two-dimensional (2D) dichalcogenide material.

20. The system of claim 11, wherein the transistor is a MX2 transistor, wherein the first semiconductor material comprises a MX2 material, wherein M is Mo, W, or Ti, and wherein X is S or Se.

21. The system of claim 11, wherein the transistor is a junctionless nanowire transistor, and wherein the first semiconductor material comprises a nanowire.

* * * * *